United States Patent [19]

Sakaguchi et al.

[11] Patent Number: 5,421,081
[45] Date of Patent: Jun. 6, 1995

[54] METHOD FOR PRODUCING ELECTRONIC PART MOUNTING STRUCTURE

[75] Inventors: Suguru Sakaguchi, Chigasaki; Toshiharu Ishida; Kooji Serizawa, both of Fujisawa; Hiroyuki Tanaka, Sapporo; Ichiro Miyano, Fujisawa; Hiroshi Nakamura, Komoro, all of Japan

[73] Assignee: Hitachi, Ltd., Tokyo, Japan

[21] Appl. No.: 59,967

[22] Filed: May 13, 1993

Related U.S. Application Data

[63] Continuation of Ser. No. 796,828, Nov. 25, 1991, abandoned.

[30] Foreign Application Priority Data

Nov. 27, 1990 [JP] Japan .................................. 2-321325

[51] Int. Cl.6 .............................................. H05K 3/34
[52] U.S. Cl. ............................................ 29/840; 29/843; 156/256; 174/52.4; 228/180.21; 439/83
[58] Field of Search ................... 156/256; 174/52.4; 228/180.22, 180.21; 439/83

[56] References Cited

U.S. PATENT DOCUMENTS

| | | | |
|---|---|---|---|
| 4,744,850 | 5/1988 | Imaro et al. | 156/256 X |
| 4,755,631 | 7/1988 | Churchwell et al. | 29/843 X |
| 4,787,135 | 11/1988 | Nagahori | 29/843 X |
| 4,982,265 | 1/1991 | Watanabe et al. | 174/52.4 X |
| 4,995,551 | 2/1991 | MacKay | 228/180.22 X |
| 5,076,485 | 12/1991 | MacKay | 228/180.21 X |
| 5,138,438 | 8/1992 | Masayuki et al. | 174/52.4 X |

FOREIGN PATENT DOCUMENTS 2-283091  11/1990  Japan ..................................... 439/83

*Primary Examiner*—Carl J. Arbes
*Attorney, Agent, or Firm*—Antonelli, Terry, Stout & Kraus

[57] ABSTRACT

A method for producing an electronic part mounting structure in which electronic parts such as IC packages are electrically connected to the surface of a printed circuit board utilizes a low-melting point metal. More particularly, the method provides an electronic part mounting structure capable of sufficiently and assuredly supplying solder to a portion between the terminal of a printed circuit board and the leads of an electric part while maintaining a predetermined thickness required to connect the printed circuit board and the electronic part to each other. By arranging the structure such that a gap, in which a solder layer having a predetermined thickness can be formed between the terminal of the printed circuit board and the lead of the electronic part to be connected to the terminal, is formed, the solder required to solder-connect the two elements can be sufficiently and assuredly supplied to the gap. Therefore, a reliable solder connection can be established.

11 Claims, 8 Drawing Sheets

METHOD FOR PRODUCING ELECTRONIC PART MOUNTING STRUCTURE

This application is a continuation application of application Ser. No. 796,828, filed Nov. 25, 1991, now abandoned.

BACKGROUND OF THE INVENTION

1. Field of the Invention

The present invention relates to a method for producing an electronic part mounting structure in which electronic parts such as IC packages are electrically connected to the surface of a printed circuit board by using low-melting point metal, More particularly, the present invention relates to a method for producing an electronic part mounting structure capable of sufficiently and assuredly supplying solder to a portion between the terminal of a printed circuit board and the leads of an electric part while maintaining a predetermined thickness required to establish a connection between the printed circuit board and the electronic part.

2. Related Art Statement

Recently, in order to meet a desire to improve the function of a multiterminal IC package and that raise the density of the same, a QFP (a Quad Flat Package: a four directional flat package) having about 200 pins or less has been used in place of an SOP (a Small Out-line Package: a two-way flat package) the number of pins of which is less than about 32. Furthermore, in a case where the number of the pins is increased to a number of 200 pins or more which exceeds the limit of the number of pins which can be provided for the QFP, a TAB (Tape Automated Bonding) has been used. Furthermore, the shape of the IC package has been changed from an insertion mounting method arranged such that an external lead of an IC package is inserted into a through hole formed in a printed circuit board before they are connected to each other by soldering to a surface mounting method in which the lead is directly connected to the surface of the printed circuit board and which thereby exhibits an excellent mounting efficiency.

The above-described conventional IC package of the narrow-pitch and multi-pin surface mounting type must maintain the flatness of its lead at a predetermined value (for example, 0.1 mm or less) by correcting the bend of the lead in order to secure the reliability of the LSI. In order to achieve this, a conventional method has been arranged in such a manner that each lead is held at the time of mounting the electronic parts on the printed circuit board or another method has been employed which is arranged in such a manner that soldering is performed while holding the lead with a load applied to the package at the time of reflow-connecting the solder. However, according to either of the above-described methods, the interval between a lead 4 of an electronic part 3 and a terminal 2 placed on the top surface of a printed circuit board 1 is narrowed excessively as shown in FIGS. 18 and 19. What is even worse, molten solder 6 undesirably overflows the junction while leaving a poor quantity of the solder 6 in the end portion of the junction, causing a problem to arise in that the quantity of the solder 6 present in the junction is insufficient to establish the connection. As a result, the junction is undesirably constituted by hard and brittle Cu-Sn alloy layers 7 and 8 composed of Sn contained in the solder 6 and Cu which is the base material of each of the lead 4 and the terminal 2. Therefore, there arises a problem in that the solder 6 cannot exhibit desired strength and thereby the reliability of the junction excessively deteriorates because impurities or Pb components contained in the solder 6 are deposited in an interface 9 between the alloy layers 7 and 8.

In order to overcome the above-described problem, a structure has been disclosed in, for example, Japanese Patent Unexamined Publication No. 60-163493 in which the lead terminal has a portion projecting toward the soldering land of the printed circuit board while forming a wedge shape to create a non-parallel gap between the lead terminal and the soldering land so as to maintain the quantity of the solder required to connect the above-described non-parallel gap. Another structure has been disclosed in, for example, Japanese Patent Unexamined Publication No. 63-315261 in which, in a case where a flexible printed board (FPC) for a thermal recording head and a substrate having a different coefficient of thermal expansion are connected to each other by thermal-pressure soldering, dummy terminals acting to adjust the distance between the above-described two elements and formed by the thick film process are provided between the same at a predetermined interval so as to, in the portion to be soldered, form a columnar portion capable of securing a height required to perform soldering.

However, although it has been said that the structure, in which the lead terminal is bent to form the wedge shape, enables the necessity of holding the lead to be eliminated and as well as a desired effect can be obtained even if the quantity of the solder supplied deviates from a predetermined quantity, the degree of bending to form the above-described wedge shape is restricted by the interval between the soldering lands formed on the printed circuit board. Furthermore, the quantity of the solder to be maintained at the non-parallel gap cannot be made constant depending upon the degree of bending to form the wedge shape. Therefore, a stable connection cannot be established by soldering. On the other hand, it is said that the structure, in which the above-described dummy terminals are formed, has an advantage in that the dummy terminals act as spacers at the time of performing heat-pressing by using a hot ram and are arranged to be disposed at proper intervals in accordance with the length to be soldered. However, if the intervals of the positions of the dummy terminals are too long, the FPC can easily be deformed, causing a problem to take place in that the height of the solder formed in each junction realized by soldering cannot be made uniform. On the contrary, if the same are too narrow, a problem takes place in that the intervals between the junctions realized by soldering becomes too wide because the number of the dummy terminals increases excessively although the above-described deformation of the FPC can be prevented. As described above, there arises the problem in that the height realized by soldering cannot be made uniform because the height excessively depends upon the intervals between the dummy terminals. Therefore, there is a technological desire to maintain the height of the solder at a predetermined height.

SUMMARY OF THE INVENTION

Accordingly, an object of the present invention is to provide a method for producing an electronic part mounting structure capable of sufficiently and assuredly supplying solder to have a predetermined thickness required to connect the terminal of a printed circuit board and the lead of an electronic part such as a TAB to each other to a portion between the terminal and the lead.

In order to achieve the above-described object, according to one aspect of the present invention, there is provided a method for producing an electric part mounting structure in which an electronic part is electrically connected to a printed circuit board by using low-melting point metal, the electric part mounting structure comprising a step of: forming a gap which enables a solder layer having a predetermined thickness to be formed between a terminal of the printed circuit board and a lead of the electronic part to be connected to the terminal. In a case where a plurality of the printed circuit boards and a plurality of the electronic parts are alternately stacked on a mother board, a structure can be constituted by forming gaps which enable solder layers each having a predetermined thickness to be formed between terminals of the printed circuit boards and leads of the electronic parts to be connected to the terminals. Also in a case where a plurality of stages of electric parts are stacked on the printed circuit board, a structure can be constituted by forming gaps which enable solder layers each having a predetermined thickness to be formed between a terminal of the printed circuit board and leads of the electronic parts to be connected to the terminal and between leads of the electronic parts. Furthermore, the gap in which the solder layer having a predetermined thickness is formed may be formed by interposing organic resin or an inorganic solid material or by interposing, in a dispersive manner, metal particles having a melting point higher than that of the solder between the terminal of the printed circuit board and the lead of the electronic part. Furthermore, it may be formed by forming a concave or projecting projection portion in either or both of the confronting surfaces of the terminal of the printed circuit board and the lead of the electronic part or it may be formed by forming a projection at a portion in the printed circuit board at which the lead is placed over the terminal of the printed circuit board while having a height which is the same as the total of the thickness of the terminal and that of the solder layer to be formed. It is preferable that the projection having a height which is the same as the total of the thickness of the terminal and that of the solder layer to be formed be made of an organic resin film, an inorganic solid material or a solder resist film. It may be formed by forming a projection having a height which is the same as the total of the thickness of the terminal, the solder layer to be formed and the lead in a portion adjacent to a junction between the terminal on the printed circuit board and the lead of the electronic part to be connected. It is also preferable that the projection portion be made of an organic resin film, an inorganic solid material or a solder resist film. The same may be formed by forming a stepped portion in a through land portion of a printed circuit board having a through hole and the through hole land portion, the stepped portion being formed between the through hole land portion and a connection pattern portion formed on the portions except for the through hole land portion. It is preferable that the above-described stepped portion be realized by the film thickness of a solder resist film composed of organic resin applied to the through hole land portion or a connecting pattern portion formed on the portions except for the through hole land portion.

Other and further objects, features and advantages of the invention will be appear more fully from the following description.

DESCRIPTION OF THE PREFERRED EMBODIMENTS

Figure 1:
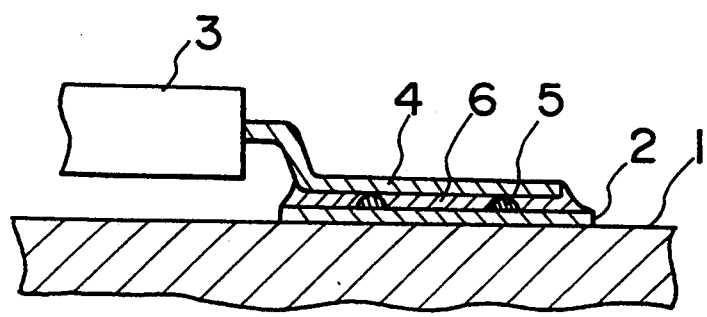
FIG. 1 is a cross sectional view which illustrates a junction of a first embodiment of an electric part mounting structure produced according to the present invention.
Figure 2:
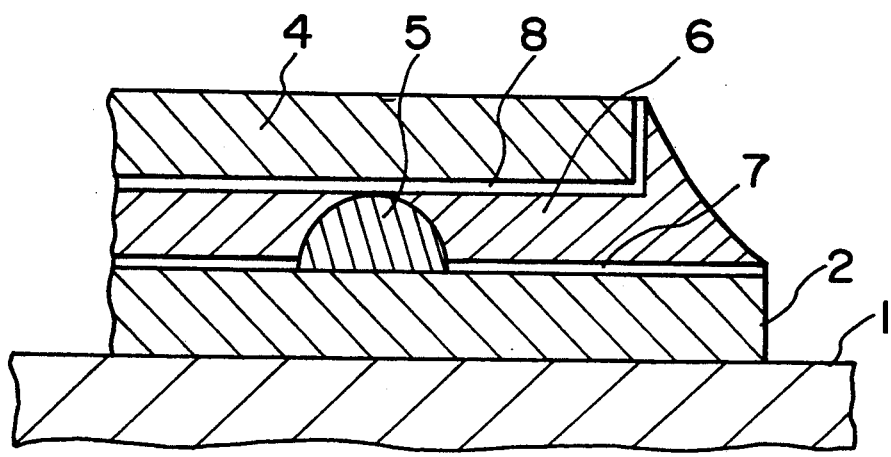
FIG. 2 is an enlarged view which illustrates an essential portion of the first embodiment shown in FIG. 1.
Figure 18:
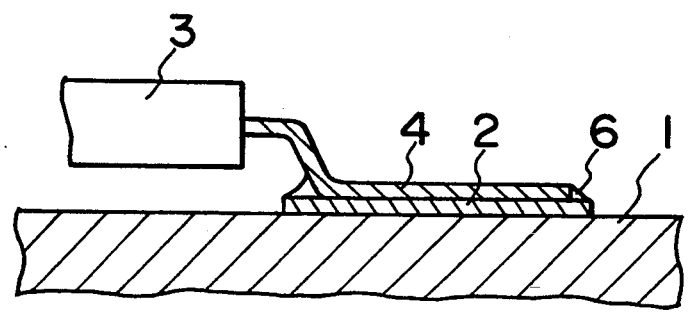
FIG. 18 is a cross sectional view which illustrates an ordinary junction of a conventional electronic part mounting structure.
Figure 19:
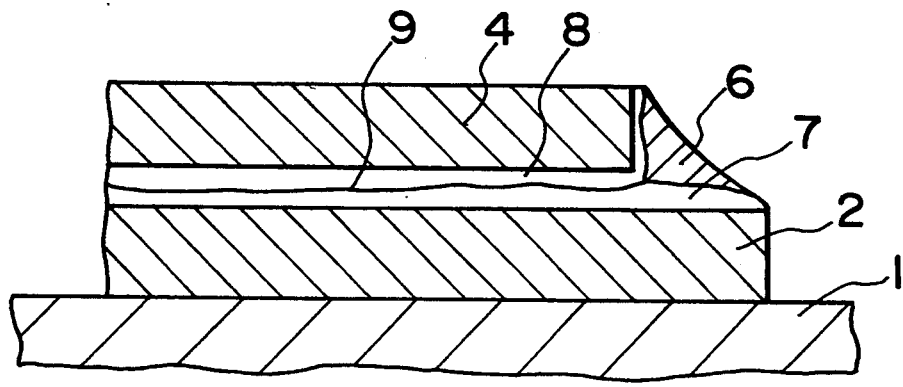
FIG. 19 is an enlarged view which illustrates an essential portion of the junction shown in FIG. 17.

Preferred embodiments of an electronic part mounting structure produced by the method according to the present invention will be sequentially described with reference to the drawings. FIG. 2 is an enlarged view which illustrates an essential portion of the structure shown in FIG. 1. Referring to FIG. 2, elements given the same reference numerals as those shown in FIGS. 18 and 19 represent the same elements.

Referring to the drawings, reference numeral 1 represents the above-described conventional printed circuit board constituted in such a manner that a terminal 2 is formed on a Cu-applied laminated substrate made of glass-base epoxy resin, the terminal 2 being formed by a conventional pattern forming method. Reference numeral 3 represents an electronic part constituted by a multiterminal plastic package including a semiconductor device, the electric part 3 having a multiplicity of leads 4 extending from the end portions thereof. Referring to the drawing, only one lead 4 of a multiplicity of the leads 4 is illustrated for the purpose of simplifying the description. Reference numeral 5 represents an organic resin for use as an epoxy resin type solder resist to be interposed between the terminal 2 and the lead 4, the organic resin 5 being arranged to form a solder layer having a predetermined desired thickness between the terminal 2 and the lead 4.

Then, a method of connecting the printed circuit board 1 and the electronic part 3 will now be described. First, paste solder is, by a screen printing method, supplied to the surface of the terminal 2. Then, the electronic part 3 is moved to the surface of the printed circuit board 1 so as to align the position of the lead 4 and that of the terminal 2 to each other before the electronic part 3 is disposed on the surface of the printed circuit board 1 as desired. In this state, a heating heater chip (omitted from illustration) is forcibly brought into contact with the top surface of the lead 4. In this case, solder 6 is composed of 63% Sn and Pb which is the balance so that the junction is melted at 183° C. The temperature of the leading portion of the heater chip is heated to, for example, 230° C. and the time in which the same is heated is set to, for example, five seconds So that the solder layer having a desired thickness is formed. Thus, the soldering connection process is completed, resulting the solder connection exhibiting satisfactory strength to be obtained. Although the above-described connecting method has been similarly performed in the conventional technology, the conventional technology cannot establish the connection having the satisfactory strength because the solder layer is not formed in the junction as shown in FIGS. 18 and 19 but the same is mainly composed of Cu-Sn alloy layers because the organic resin 5 according to this embodiment is not used. FIGS. 1 and 2 illustrate a state in which the solder connection has been completed.

According to this embodiment, the gap for forming the solder layer having a predetermined desired thickness between the terminal 2 and the lead 4 is obtained by printing the organic resin 5. However, inorganic type glass paste or ceramic like may be used in place of the organic resin 5. Also in this case, the operation and the effect obtainable from the above-described embodiment can be obtained.

Figure 3:
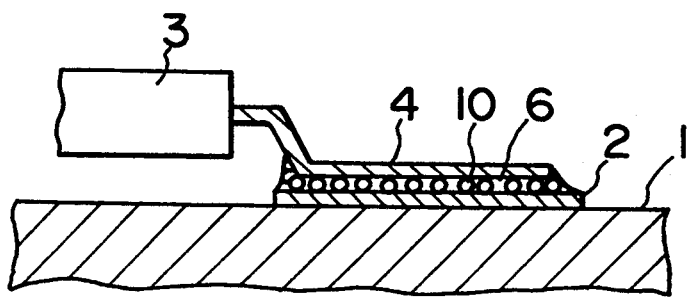
FIG. 3 is a cross sectional view which illustrates a junction according to a second embodiment produced by the method of the present invention.
Figure 4:
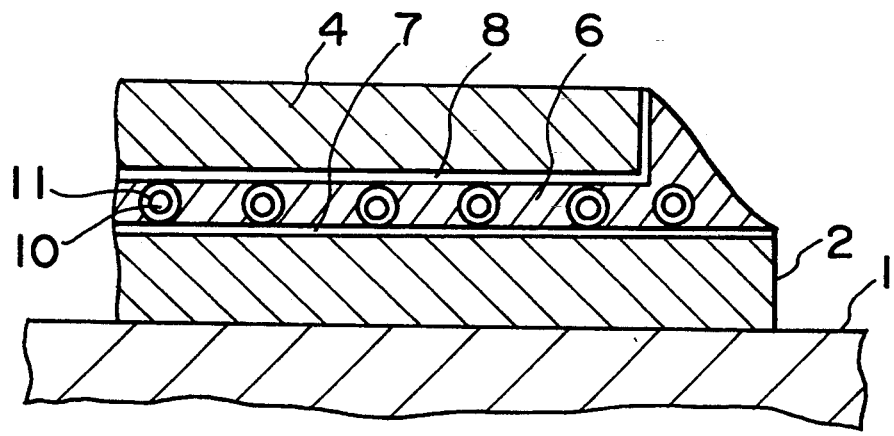
FIG. 4 is an enlarged view which illustrates an essential portion of the junction shown in FIG. 3.

Then, a second embodiment of the present invention will now be described with reference to FIGS. 3 and 4. FIG. 3 is a cross sectional view which illustrates a junction according to this embodiment and FIG. 4 is an enlarged view which illustrates an essential portion of FIG. 3. Referring to FIGS. 3 and 4, elements given the same reference numerals as those shown in FIGS. 1 and 2 represent the same elements.

Referring to FIGS. 3 and 4, reference numeral 10 represents Cu particles, the melting point of which is higher than that of the solder 6 and having similar particle size to that of the solder 6, the particle size being ordinarily arranged to be in a range from about 10 to 50 μm. Reference numeral 11 represents alloy layers formed around the Cu particles 10 similarly to the alloy layer 7 or 8. The connecting process according to this embodiment will now be described. First, solder paste containing Cu particles 10 mixed is supplied to the surface of the terminal 2 of the printed circuit board 1 by the screen printing method. Then, the lead 4 and the terminal 2 are positioned as desired so as to place the electronic part 3 on the printed circuit board 1. In this state, the heating heater chip is forcibly brought into contact with the surface of the lead 4 so as to heat the junction, causing the solder 6 to be melted. Simultaneously with melting of the solder 6, the Cu particles are distributed dispersively on the surface of a portion between the terminal 2 and the lead 4. As a result, gaps corresponding to the above-described particle size can be formed so that the solder layer having a predetermined thickness is formed. By cooling the solder layer in which the Cu particles 10 are dispersively distributed, the solder connection process is completed. Also according to this embodiment, the terminal 2 and the lead 4 can be connected by soldering via the solder 6 having a predetermined thickness while exhibiting satisfactory strength similar to the first embodiment of the present invention.

The particle size of the Cu particles 10, of course, is not limited to the above-described size. Furthermore, the present invention is not limited to the above-described composition using Cu. Any material, for example, Ni, Fe, W, Mo or the like having a melting point higher than that of the solder 6 may, of course, be employed.

Figure 5:
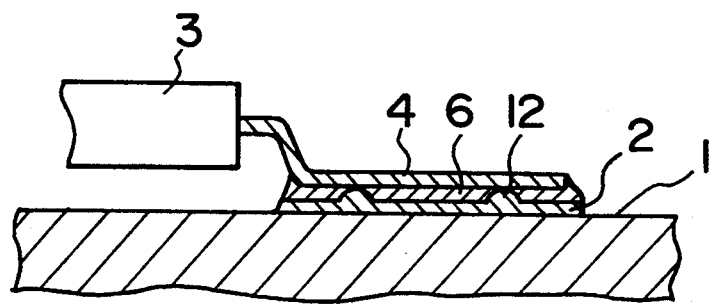
FIG. 5 is a cross sectional view which illustrates the junction shown in FIG. 3 wherein projecting portions are formed on the terminal.
Figure 6:
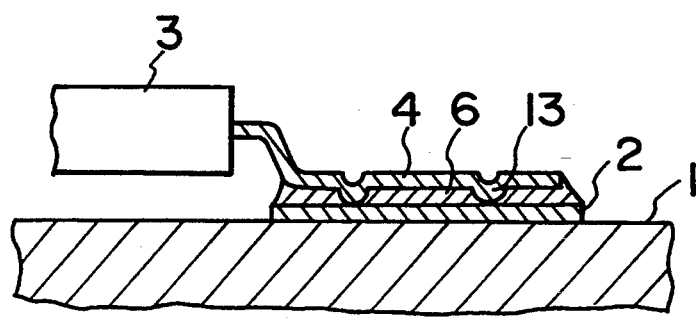
FIG. 6 is a cross sectional view which, similarly to FIG. 5, illustrates the junction wherein projecting portions are formed on a lead of the electric part.

Then, a third embodiment of the present invention will now be described with reference to FIGS. 5 and 6. FIG. 5 is a cross sectional view which illustrates a junction according to this embodiment in which projecting portions are formed on the terminal. FIG. 6 is also a cross sectional view which illustrates a junction according to this embodiment similarly to FIG. 5 but the projecting portions are formed on the lead. Referring to the drawings, the same reference numerals as those shown in FIGS. 1 and 2 represent the same elements.

Referring to FIG. 5, reference numeral 12 represents projecting portions formed on the terminal 2 for the purpose of forming the solder layer having a predetermined thickness between the terminal 2 and the lead 4. The projecting portions 12 are formed in such a manner that a plating resist film having exposed portions corresponding to the projecting portions 12 to be formed is formed on the Cu pattern formed on the printed circuit board 1 before the terminal 2 is formed. Then, Cu-plating is performed so that the projecting portions 12 are formed. Then, the above-described plating resist film is separated before the terminal 2 and the projecting portions 12 are again covered with a resist film and unnecessary Cu pattern portions except for that for the terminal 2 are removed by etching. As a result, the projecting portion pattern according to this embodiment is formed.

Referring to FIG. 6, reference numeral 13 represent projecting portions formed on the surface of the lead 4 which is connected by soldering. The projecting portions 13, similarly to the above-described projecting portions 12, form a gap between the terminal 2 and the lead 4 so as to form the solder layer having a predetermined thickness. The projecting portions 13 can be formed by the above-described method similarly to a case when the projecting portions 12 are formed by means of stacking by the partial plating method. Another method may as well as be employed in which a stepped portion is formed by partially removing the portions other than the projecting portions 12 by etching. In addition, a portion of the lead 4 may be deformed by mechanical pressing.

Figure 7:
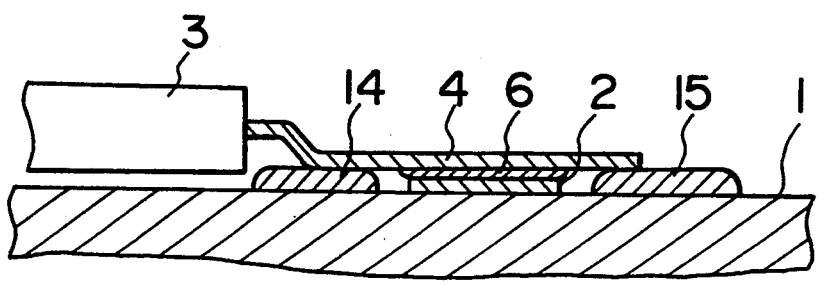
FIG. 7 is a cross sectional view which illustrates a junction according to an example of a fourth embodiment of the present invention.
Figure 8:
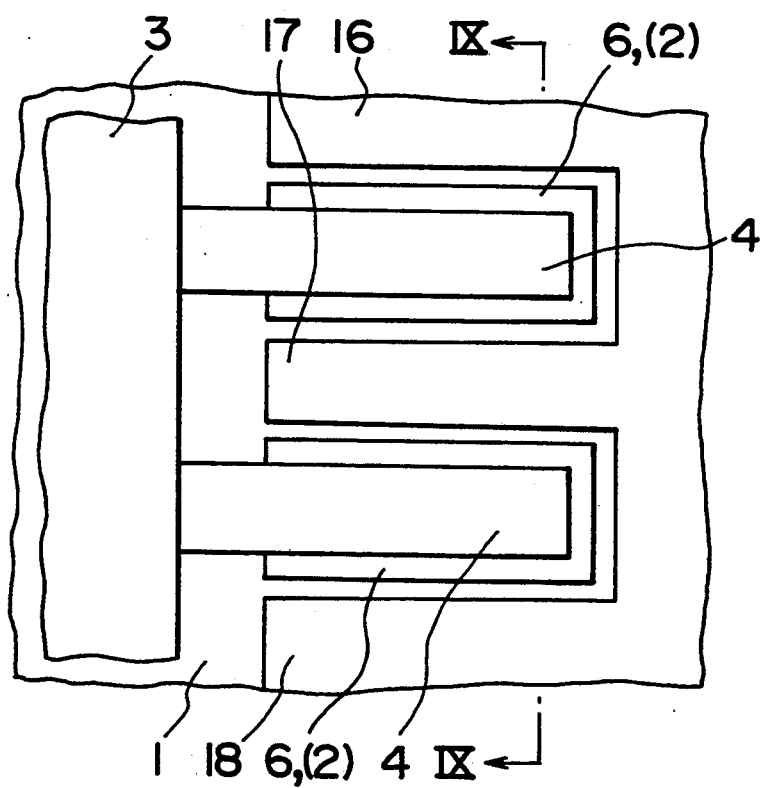
FIG. 8 is a plan view which illustrates the same according to another example of the fourth embodiment of the present invention.
Figure 9:
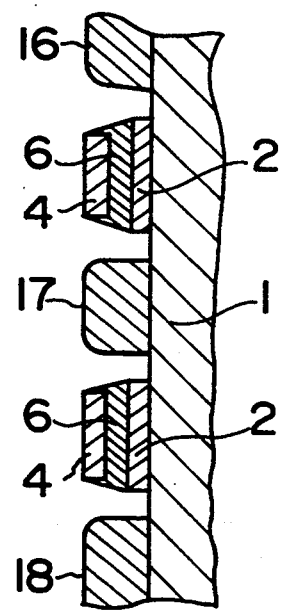
FIG. 9 is a cross sectional view taken along line IX—IX of FIG. 8.

Then, a fourth embodiment of the present invention will now be described with reference to FIGS. 7 to 9. FIG. 7 is a cross sectional view which illustrates a junction according to an example of this embodiment and FIG. 8 is a plan view which illustrates the same according to another example of this embodiment. FIG. 9 is a cross sectional view taken along line IX—IX of FIG. 8. Referring to the drawings, the elements given the same reference numerals as those shown in FIGS. 1 and 2 are the same elements.

Referring to FIG. 7, reference numerals 14 and 15 represent projections formed on the printed circuit board 1 at positioned under the lower surface of the lead 4 and as well as at positions at which the lead 4 is placed over the terminal 2. The height of each of the projections 14 and 15 is arranged to be the same as the total thickness of the height of the terminal 2 and that of the solder 6 to be formed. Therefore, a gap of a thickness which corresponds to the height of each of the projections 14 and 15, is formed between the terminal 2 and the lead 4 for the purpose of forming the solder layer having a predetermined thickness. Then, the junction is soldered by the above-described connecting process in the above-described state so that the solder connection exhibiting satisfactory strength can be obtained by virtue of the solder 6 having a predetermined thickness between the terminal 2 and the lead 4.

Referring to FIGS. 8 and 9, reference numerals 16, 17 and 18 represent projections formed adjacent to the junctions between the terminal 2 and the lead 4 to be connected to the terminal 2. The height of each of the projections 16, 17 and 18 is arranged to be the total height of the thickness of each of the terminal 2, the formed solder 6 and the lead 4. Therefore, a gap for forming the solder layer having a thickness corresponding to the height of each of the projections 16, 17 and 18 is formed between the terminal 2 and the lead 4. When heat is applied by usihg the heater chip, the leading portion of the heater chip is brought into contact with all of the top surface of the lead 4 and the top surfaces of the projections 16, 17 and 18 so as to be connected by soldering.

As described above, according to the fourth embodiment of the present invention, the thickness of the junction can be arbitrarily determined by changing the thickness of the projection to be formed. Therefore, a desired solder layer required to connect the terminal 2 and the lead 4 to each other can be formed so that the solder connection exhibiting satisfactory strength can be obtained.

The above-described projections 14, 15, 16, 17 and 18 may be composed by any one of an organic resin film, an inorganic solid material or a solder resist film.

Figure 10:
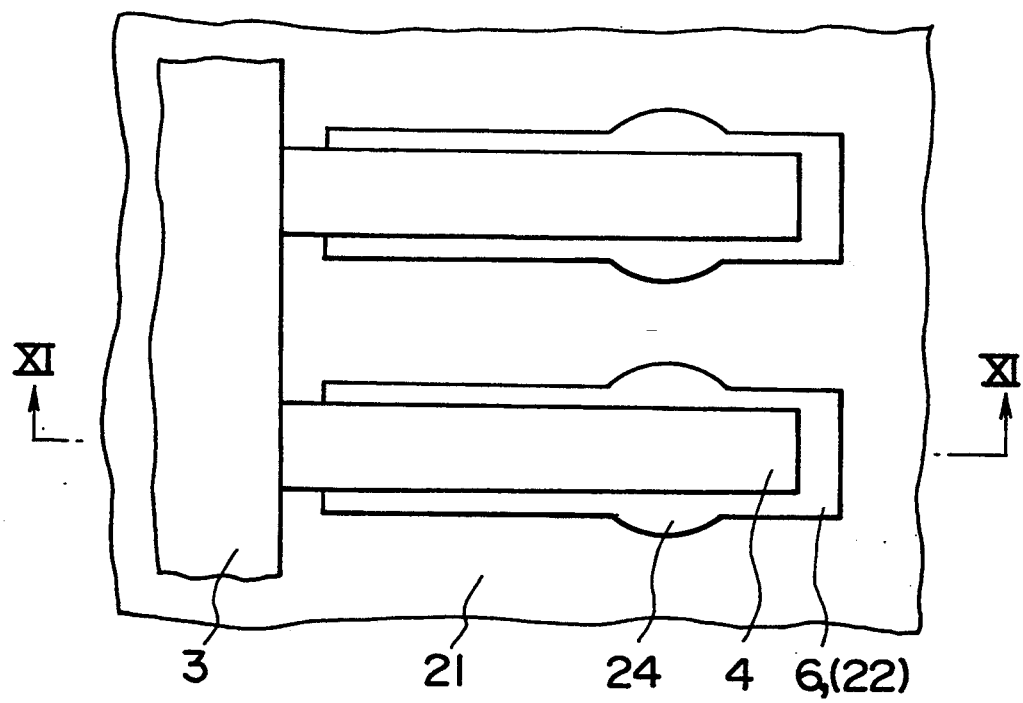
FIG. 10 is a plan view which illustrates a junction according to a fifth embodiment of the present invention.
Figure 11:
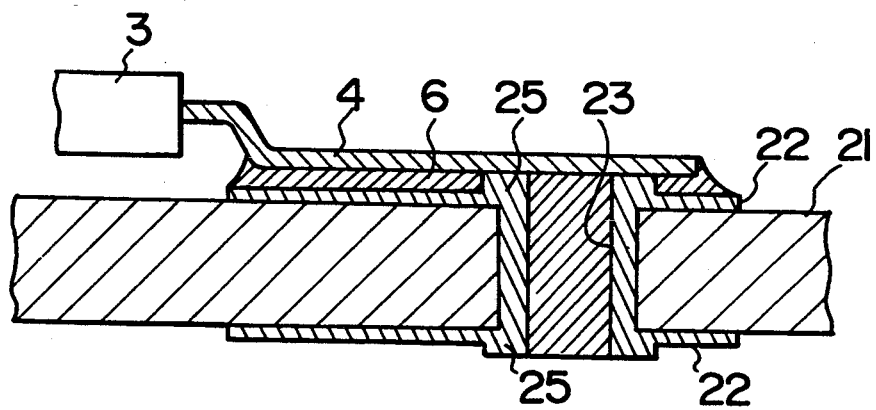
FIG. 11 is a cross sectional view taken along line XI—XI of FIG. 10.
Figure 12:
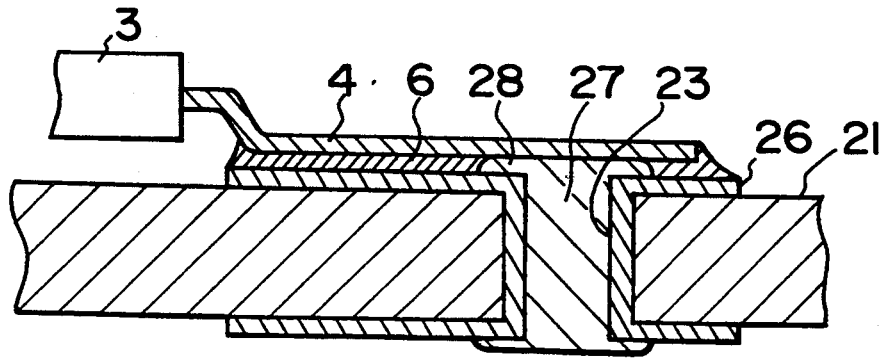
FIG. 12 is a cross sectional view corresponding to FIG. 11.

Then, a fifth embodiment of the present invention will now be described with reference to FIGS. 10 to 12. FIG. 10 is a plan view which illustrates a junction according to this embodiment, FIG. 11 is a cross sectional view taken along line XI—XI of FIG. 10 and FIG. 12 is a cross sectional view corresponding to FIG. 11. Referring to the drawings, elements given the same reference numerals as those shown in FIGS. 1 and 2 are the same elements.

Referring to FIGS. 10 and 11, reference numeral 21 represents a printed circuit board having a through hole 23 formed therein. Reference numeral 22 represents a terminal formed on the printed circuit board 21. The terminal 22 has the through hole 23 and a through hole land portion 24 formed in a portion thereof so that the terminal 22 is connected to the lead 4 at the surface of the terminal 22 and the through hole 23 by the solder 6. Reference numeral 25 represents a projection formed on the through hole land portion 24, the projection 25 forming a stepped portion between the through hole land portion 24 and the connection pattern portion except for the through hole land portion 24.

Then, an example of the connection process according to this embodiment will now be described. First, solder paste is, by the screen printing method, supplied to the terminal 22 and the through hole 23. Then, the lead 4 and the terminal 22 are positioned as designed before the electronic part 3 is placed on the printed circuit board 21. At this time, the lead 4 is disposed to cover the projection 25 formed on the through hole 23 so that a gap for forming the solder layer having a predetermined thickness is formed by virtue of the stepped portion formed by the projection 25. Then, the heating heat chip is brought into contact with the surface of the lead 4 in this state so that the solder 6 is melted. As a result, the gap is filled with the molten solder 6 so that the solder connection is established. The projection 25 can be formed by performing through-hole plating while covering the through hole portion 23 and portions except for the through hole land portion 24 with the resist film. Although the solder is supplied by the printing of the solder paste according to this embodiment, it can be satisfactorily supplied by plating and molten solder dipping method.

Referring to FIG. 12, reference numeral 26 represents a terminal having the projection 25 shown in FIG. 11 and 27 represents Ag paste injected into the through hole 23, the Ag paste 27 being used to form a projection 28 by upwardly enlarging the through hole land portion 24. Also in this case, a stepped portion formed by the projection 28 acts to form a gap for forming the solder layer having a predetermined thickness, resulting similar operation and effects to those obtainable from the structure shown in FIG. 11. Since the Ag paste 27 is supplied by screen printing according to this embodiment, an electrical connection can be established between the upper pattern and the lower pattern of the printed circuit board 21 while eliminating a necessity of forming a side surface plating in the through hole 23. Therefore, an effect can be obtained in that the cost for manufacturing the printed circuit board 21 can significantly be reduced.

The through hole 23 may be filled with the epoxy solder paste or the like in place of the Ag paste 27.

Figure 13:
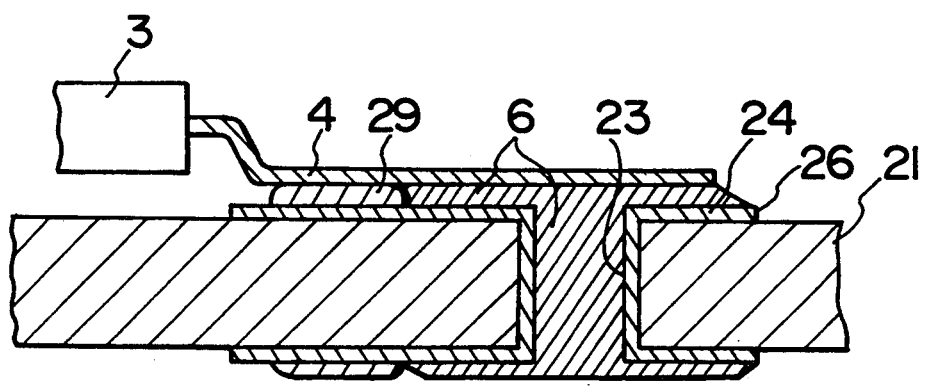
FIGS. 13 and 14 are cross sectional views which illustrate a junction according to a sixth embodiment of the present invention wherein the lead is connected by soldering through hole lands and a through hole.
Figure 14:
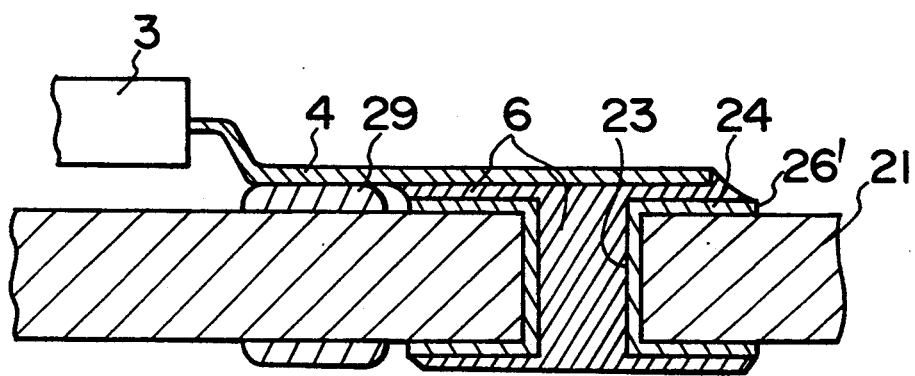

Then, a sixth embodiment of the present invention will now be described with reference to FIGS. 13 and 14. According to this embodiment, the lead 4 is connected by soldering the through hole land and the portion in the through hole. FIGS. 13 and 14 are cross sectional views which illustrate junctions according to this embodiment. Referring to the drawings, elements given the same reference numerals as those shown in FIGS. 1 and 2 are the same elements.

Referring to FIG. 13, reference numeral 29 represents a solder resist film formed on the terminal 26 and composed of an organic resin. The thickness of the solder resist film 29 can be arbitrarily set. The lead 4 is disposed on the through hole 23 via the solder resist film 29. The lead 4 and the terminal 26 are connected to each other by the solder 6 in the through hole 23 and the through hole land portion 24. The thickness of the solder 6 at the junction is determined by a gap formed by the determined thickness of the solder resist film 29. Therefore, a predetermined required thickness of the solder layer 6 can be realized by changing the thickness of the solder resist film 29. As a result, the solder connection exhibiting satisfactory strength can be realized.

FIG. 14 illustrates a structure in which the solder resist film 29 is directly formed on the printed circuit board 21 and which is similarly constituted as that shown in FIG. 13 except for an arrangement in which the length of a terminal 26' is made to be shorter than that of the terminal 26 shown in FIG. 13 by a length corresponding to the direct forming of the solder resist film 29. In this case, an effect can be obtained in that the adhesion of the solder resist film 29 and the heat resistance of the same are improved in comparison to the structure shown in FIG. 13.

Figure 15:
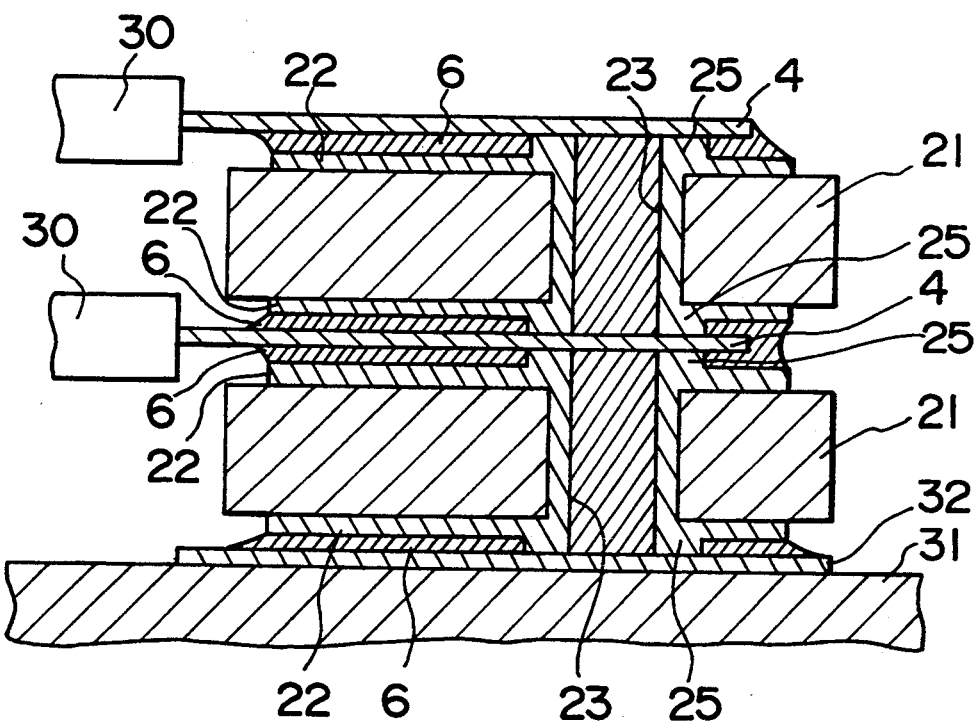
FIG. 15 is a cross sectional view which illustrates a junction according to a seventh embodiment of the present invention wherein a plurality of printed circuit boards and electronic parts are alternately stacked and connected to one another.

Then, a seventh embodiment of the present invention will now be described with reference to FIG. 15. According to the mounting structure shown in FIG. 11 is arranged in such a manner that one printed circuit board having the through hole and one electric part are connected to each other. However, according to this embodiment, a plurality of the above-described elements are alternately stacked to be connected. FIG. 15 is a cross sectional view which illustrates a junction according to this embodiment. Referring to the drawing, elements given the same reference numerals as those shown in FIGS. 10 to 14 are the same elements.

Referring to FIG. 15, reference numeral 30 represents electronic parts each of which is arranged similarly to the above-described embodiments, 31 represents a mother board and 32 represents a terminal formed on the mother board 31. On the terminal 32, the first printed circuit board 21 and the electronic part 30 are disposed and the second printed circuit board 21 and the electronic part 30 are stacked on the above-described first elements. In this case, the projection 25 is formed in each of the upper and the lower through hole land portions 24. Therefore, stepped portions are formed from the connection patterns in the portions of the upper and the lower terminals 22 except for the through hole land portion 24. The stepped portions thus-formed form gaps each having a predetermined thickness. It is preferable that each of the above-described steps be formed by a solder resist film made of the organic resin applied to the connecting pattern portions other than the through hole land portions 24.

Then, the connecting process according to this embodiment will now be described. The terminal 32 of the mother board 31 and the upper and the lower terminals 22 of each printed circuit board 21 have been supplied with the solder at the time of forming the pattern. In this state, the terminal 32 and the lower terminal 22 of the first printed circuit board 21 are positioned as designed before they are temporarily held. Then, the lead 4 of the first electronic part 30 and the upper terminal 22 of the first printed circuit board 21 are positioned as designed before they are temporarily held. Then, similarly to the first elements, the second printed circuit board 21 and the electronic part 30 are positioned as designed before they are temporarily held. In the thus-realized state in which they are temporarily held, flux is applied to each junction so that a state of waiting for heat application is realized. Then, the heating heat chip is forcible brought into contact with the upper surface of the second lead 4 so that the solder placed in each gap is melted so that each gap is filled with the molten solder 6 and therefore the solder connection is performed.

According to the above-described embodiment, the description is made about the structure in which the two layers are formed by the printed circuit boards 21 and the electronic parts. However, a similar operation and effect can, of course, be obtained from a structure composing two or more layers. Furthermore, although the solder 6 is melted by forcibly bringing the heating heater chip, another solder reflowing method, for example, a method in which the solder is again melted in a heating furnace may be employed. In addition, although the gaps each having a predetermined thickness are formed between the terminals 22 or 32 and the leads 4 by the stepped portions formed by the projections 25, they may, of course, be formed by any one of the structures respectively shown in FIGS. 1 to 9, 13 and 14.

Figure 16:
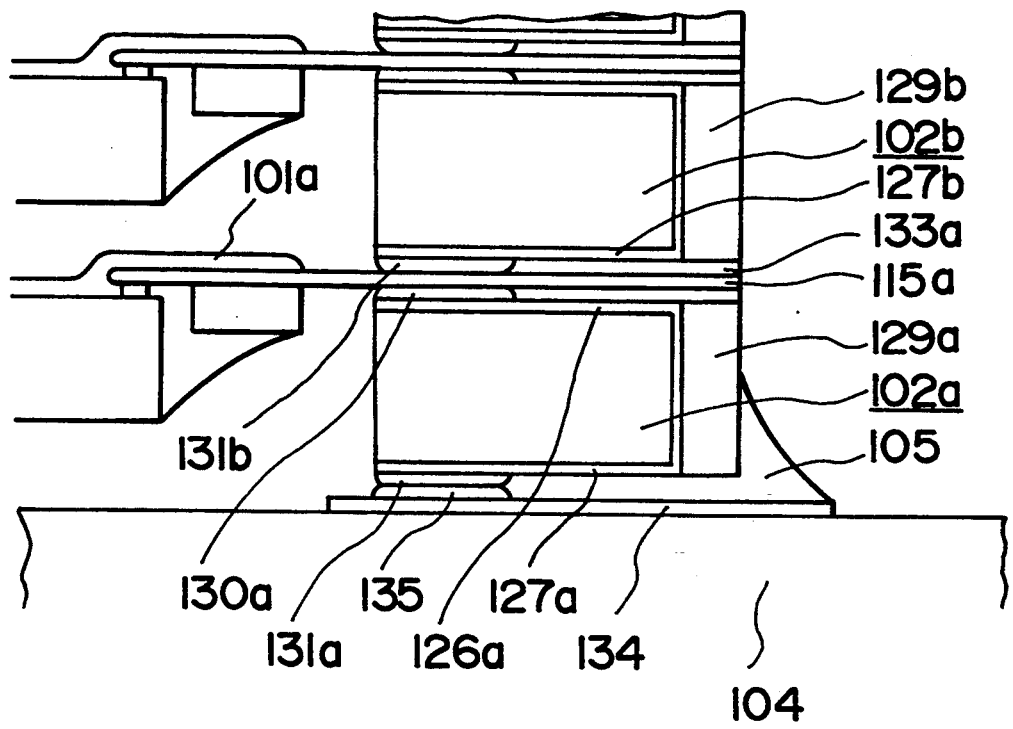
FIG. 16 is a cross sectional view which illustrates a junction according to an eighth embodiment of the present invention wherein a plurality of printed circuit boards and electronic parts are alternately stacked and connected to one another.

Then, an eighth embodiment of the present invention will now be described with reference to FIG. 16. According to this embodiment, a plurality of the elements to be connected to one another are alternately stacked. Referring to FIG. 16, a first connector frame 102a has a top surface terminal 126a and a lower surface terminal 127a respectively having a top surface spacer 130a and a lower surface spacer 131a formed thereon. The top surface terminal 126a and the lower surface terminal 127a are connected to each other by an end surface through hole 129a. Also a second connector frame 102b is structured similarly to the first connector frame 102a. An outer lead 115a of a TCP 101a passes through a portion between the top surface terminal 126a and the lower surface terminal 127b while being held between the top surface spacer 130a and the lower surface spacer 131b until it reaches the end portion of the connector frame. Solder 133a is supplied to the surface of each of the end surface through hole 129a, the top surface terminal 126a and the lower surface terminal 127b such that it is supplied to the overall portion of the junction.

A mother board 104 has a substrate terminal 134 which has, on the top surface thereof, a substrate spacer 135. The substrate spacer 135 and the lower surface spacer 131a of the connector frame 102a are positioned in contact with each other while confronting each other. The spacers 135 and 131a maintain a predetermined gap between the substrate terminal 134 and the lower surface terminal 127a of the connector frame 102a so as to be filled with solder 105.

Figure 17:
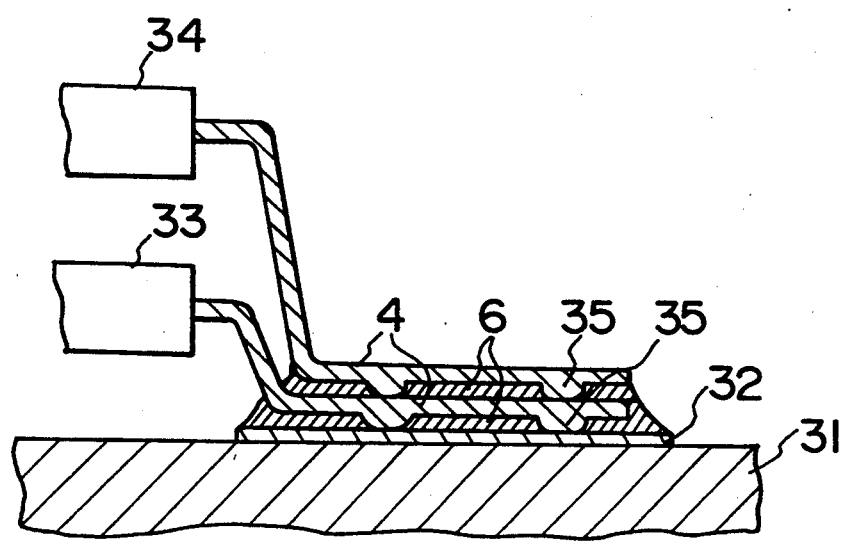
FIG. 17 is a cross sectional view which illustrates a junction according to a ninth embodiment of the present invention wherein a plurality of electronic parts are stacked and connected to the surface of a mother board.

Then, a ninth embodiment of the present invention will now be described with reference to FIG. 17. According to this embodiment, a plurality of the electronic parts are stacked on the mother board. Furthermore, the terminal formed on the mother board and the leads of the electronic parts connected to the terminal of the mother board are connected to each other and as well as the leads of the electronic parts stacked are connected to one another. FIG. 17 is a cross sectional view which illustrates a junction according to this embodiment. Referring to FIG. 17, elements given the same reference numerals as those shown in FIGS. 5 to 15 are the same elements.

Referring to FIG. 17, reference numerals 33 and 34 represent the electronic parts arranged similarly to those according to the above-described embodiments, each of the electronic parts 33 and 34 has the first and second stages. Reference numeral 4 represents leads respectively extending from the electronic parts 33 and 34. Reference numeral 35 represents a projecting portion formed in the connecting portion of the lead 4. Similarly to the structures shown in FIGS. 5, 6 and 15, stepped portions are formed to form stepped portions from the connecting pattern portions except for the projecting portions 35 so that gaps each having a predetermined thickness are formed.

Then, the connecting process according to this embodiment will now be described. The terminal 32 of the mother board 31 has been supplied with the solder by the screen printing method at the time of forming the pattern. In this state, the first stage lead 4 is positioned on the terminal 32 as designed before they are temporarily held. Then, the lead 4 of the second stage electronic part 34 is positioned on the lead 4 of the first stage electronic part 33 before they are temporarily held. In the thus-realized temporary held state, flux is applied to each junction before the heating heater chip is forcible brought into contact with the top surface of the second stage lead 4. As a results, the solder present in each gap is melted. Then, each gap is filled with the solder 6 so that the solder connection is established.

According to the above-described embodiment, the electronic parts 33 and 34 are stacked to form the two layers. A similar operation and effect can, of course, be obtained from a structure in which two or more layers are formed. In addition, the solder 6 is melted by forcibly bringing the heating heater chip into contact with the lead 4. However, it may be replaced by the solder reflowing method.

As described above, according to the present invention, the gap for forming the solder layer having a predetermined thickness between the terminal of a printed circuit board and the lead of an electronic part such as a TAB is formed. Therefore, even if the lead of the electronic part is held at the time of the solder reflowing process, solder of a quantity required to establish the solder connection is sufficiently and reliably supplied between the terminal of the printed circuit board and the lead. Consequently, a reliable solder connection can be established.

Although the invention has been described in its preferred form with a certain degree of particularly, it is understood that the present disclosure of the preferred form has been changed in the details of construction and the combination and arrangement of parts may be resorted to without departing from the spirit and the scope of the invention as hereinafter claimed.

What is claimed is:

1. Method for producing an electric part mounting structure in which an electronic part is electrically connected to a printed circuit board by using low-melting point metal, said method comprising a step of:
   forming a gap which enables a solder layer having a predetermined thickness to be formed between a terminal of said printed circuit board and a lead of said electronic part to be connected to said terminal, said gap being formed by interposing, in a dispersive manner, metal particles having a melting point higher than that of said solder between said terminal of said printed circuit board and said lead of said electronic part.

2. Method for producing an electric part mounting structure in which an electronic part is electrically connected to a printed circuit board by using low-melting point metal, said method comprising the steps of:
   alternately stacking, on a mother board, a plurality of said printed circuit boards and a plurality of said electronic parts; and
   forming gaps which enable solder layers each having a predetermined thickness to be formed between terminals of said printed circuit boards and leads of said electronic parts to be connected to said terminals.

3. A method according to claim 2, wherein said gaps in which said solder layers each having a predetermined thickness are formed, are formed by interposing organic resin between said terminals of said printed circuit boards and said leads of said electronic parts.

4. A method according to claim 2, wherein said gaps in which said solder layers each having a predetermined thickness are formed, are formed by interposing inorganic resin between said terminals of said printed circuit boards and said leads of said electronic parts.

5. A method according to claim 2, wherein said gaps in which said solder layers each having a predetermined thickness are formed, are formed by interposing, in a dipsersive manner, metal particles having a melting point higher than that of said solder between said terminals of said printed circuit boards and said leads of said electronic parts.

6. A method according to claim 2, wherein said gaps in which said solder layers each having a predetermined thickness are formed, are formed by forming projection portions in either or both of confronting surfaces of said terminals of said printed circuit boards and said leads of said electronic parts.

7. A method according to claim 2, wherein said gaps in which said solder layers each having a predetermined thickness are formed, are formed by forming stepped portions in through land portions of printed circuit boards having through holes and said through land portions, said stepped portions being formed between said through hole land portions and connection pattern portions formed on the portions except for said through hole land portions.

8. A method according to claim 7 wherein each of said stepped portions is provided by a film thickness of a solder resist film composed of organic resin applied to said through hole land portions or connecting pattern portions formed on the portions except for said through hole land portions.

9. Method for producing an electronic part mounting structure in which an electronic part is electrically connected to a printed circuit board by using low-melting point metal, said method comprising steps of:
   forming a gap which enables a solder layer having a predetermined thickness to be formed between a terminal of said printed circuit board and a lead of said electronic part to be connected to said terminal, said gap in which said solder layer having a predetermined thickness is formed, being formed by interposing inorganic resin between said terminal of said printed circuit board and said lead of said electronic part; and
   forming the solder layer in said gap.

10. Method for producing an electric part mounting structure in which an electronic part is electrically connected to a printed circuit board by using low-melting point metal, said method comprising the steps of:
   forming a gap which enables a solder layer having a predetermined thickness to be formed between a terminal of said printed circuit board and a lead of said electronic part to be connected to said terminal, said gap in which said solder layer having a predetermined thickness is formed, being formed by interposing inorganic resin between said terminal of said printed circuit board and said lead of said electronic part; and forming the solder layer in said gap.

11. Method for producing an electric part mounting structure in which an electronic part is electrically connected to a printed circuit board by using low-melting point metal, said method comprising steps of:

forming a gap which enables a solder layer having a predetermined thickness to be formed between a terminal of said printed circuit board and a lead of said electronic part to be connected to said terminal, said gap in which said solder layer having a predetermined thickness is formed, being formed by providing projection portions in a confronting surface of said terminal of said printed board, said projection portions contacting said lead of said electronic part; and forming a solder layer within said gap around said projection portions.

* * * * *